(12) United States Patent
Touzelbaev et al.

(10) Patent No.: US 8,304,291 B2
(45) Date of Patent: Nov. 6, 2012

(54) SEMICONDUCTOR CHIP THERMAL INTERFACE STRUCTURES

(75) Inventors: Maxat N. Touzelbaev, San Jose, CA (US); Gamal Refai-Ahmed, Markham (CA)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 202 days.

(21) Appl. No.: 12/493,352

(22) Filed: Jun. 29, 2009

(65) Prior Publication Data

US 2010/0327431 A1 Dec. 30, 2010

(51) Int. Cl.
*H01L 21/00* (2006.01)
*H01L 23/10* (2006.01)

(52) U.S. Cl. ............... 438/122; 257/706; 257/707

(58) Field of Classification Search .......... 438/122; 257/706, 707

See application file for complete search history.

(56) References Cited

U.S. PATENT DOCUMENTS

| | | | | |
|---|---|---|---|---|
| 6,856,016 B2* | 2/2005 | Searls et al. | ............... | 257/720 |
| 7,180,174 B2* | 2/2007 | Koning et al. | ............... | 257/706 |
| 7,453,154 B2* | 11/2008 | Teo et al. | ............... | 257/777 |
| 7,476,967 B2* | 1/2009 | Dubin | ............... | 257/706 |
| 7,538,422 B2* | 5/2009 | Dangelo et al. | ............... | 257/706 |
| 7,569,424 B2* | 8/2009 | Nystrom et al. | ............... | 438/119 |
| 2004/0266065 A1* | 12/2004 | Zhang et al. | ............... | 438/122 |
| 2006/0138643 A1* | 6/2006 | Lu et al. | ............... | 257/706 |
| 2007/0102809 A1* | 5/2007 | Dubin | ............... | 257/713 |
| 2007/0235847 A1* | 10/2007 | Ramanathan et al. | ............... | 257/678 |
| 2008/0001284 A1 | 1/2008 | Yuen et al. | | |
| 2008/0290503 A1* | 11/2008 | Karavakis et al. | ............... | 257/713 |
| 2009/0218681 A1* | 9/2009 | Chrysler et al. | ............... | 257/713 |
| 2009/0237886 A1* | 9/2009 | Iwai et al. | ............... | 361/708 |
| 2009/0246507 A1* | 10/2009 | Graham et al. | ............... | 428/323 |
| 2009/0266477 A1* | 10/2009 | Weisenberger | ............... | 156/185 |
| 2009/0269604 A1* | 10/2009 | Wang et al. | ............... | 428/545 |
| 2009/0298235 A1* | 12/2009 | Kostiew et al. | ............... | 438/118 |

OTHER PUBLICATIONS

Quoc Ngo et al.; *Thermal Interface Properties of Cu-filled Vertically Aligned Carbon Nanofiber Arrays*; Nano Letters 2004 of the American Chemical Society; vol. 4, No. 12; pp. 2403-2407.
Matthew M. Yuen et al.; *Thermal Interface Material (TIM) with Carbon Nanotube (CNT)*; Dept. of Mechanical Engineering Hong Kong University of Science and Technology; 2007. 3; pp. 1-12.
Giles Humpston; *Principles of Soldering*; ASM International; 2004; pp. 1-2 and 103.
Rudolf F. Graf; *Modern Dictionary of Electronics—7th Edition*; 1999; p. 266.

* cited by examiner

*Primary Examiner* — James Mitchell

(74) *Attorney, Agent, or Firm* — Timothy M. Honeycutt

(57) ABSTRACT

Various thermal interface structures and methods are disclosed. In one aspect, a method of manufacturing is provided. The method includes providing plural carbon nanotubes in a thermal interface structure. The thermal interface structure is soldered to a side of a semiconductor chip. In another aspect, an apparatus is provided. The apparatus includes a thermal interface structure that has plural carbon nanotubes. A semiconductor chip is soldered to the thermal interface structure.

17 Claims, 5 Drawing Sheets

SEMICONDUCTOR CHIP THERMAL INTERFACE STRUCTURES

BACKGROUND OF THE INVENTION

1. Field of the Invention

This invention relates generally to semiconductor processing, and more particularly to thermal interface materials and structures utilizing carbon nanotubes and methods of making the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

A solder thermal interface material like indium has favorable thermal properties that work well for high power-high temperature die. However, some solders are useful as thermal interface materials, such as indium, exhibit relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing.

Solders used for thermal interface materials may not natively bond well with materials commonly used for package lids. Wetting layers are often applied to the applicable surface of the lid to facilitate solder bonding. Even with such wetting layers, the metallurgical bond between a conventional solder interface material and a semiconductor chip package lid can be subjected to considerable shear stresses. The chief cause of such shear stresses is mismatches in coefficients of thermal expansion between the semiconductor chip, the solder thermal interface material and the overlying lid. As the system of those three components goes through thermal cycling during testing or actual operation, the thermal interface material to lid bond undergoes cyclic shear stresses. Delamination can occur, leading to reduce thermal conduction and hot spots.

The present invention is directed to overcoming or reducing the effects of one or more of the foregoing disadvantages.

SUMMARY OF THE INVENTION

In accordance with one aspect of the present invention, a method of manufacturing is provided. The method includes providing plural carbon nanotubes in a thermal interface structure. The thermal interface structure is soldered to a side of a semiconductor chip.

In accordance with another aspect of the present invention, a method of manufacturing is provided. The method includes coupling a thermal interface structure to a side of a heat spreader. The thermal interface structure includes plural carbon nanotubes that have first ends and second ends. At least one solderable metal layer coats the second ends. The thermal interface structure is soldered to a side of a semiconductor chip that is coupled to a carrier substrate.

In accordance with another aspect of the present invention, an apparatus is provided. The apparatus includes a thermal interface structure that has plural carbon nanotubes. A semiconductor chip is soldered to the thermal interface structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip package are described herein. One example includes a semiconductor chip mounted on a carrier substrate and topped with a lid that serves as a heat transport structure. A solder thermal interface material is positioned between the semiconductor chip and the lid. A thermal interface structure is positioned between the solder thermal interface material and the lid and contains a quantity of carbon nanotubes. Additional details will now be described.

Figure 1:
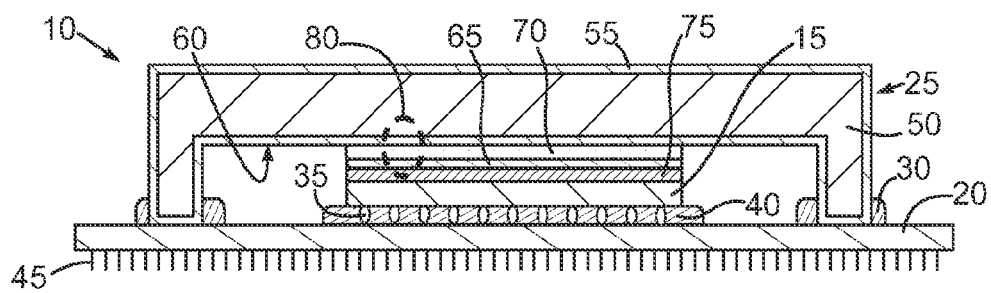
FIG. 1 is a sectional view of an exemplary embodiment of a semiconductor chip package that includes a semiconductor chip mounted on a semiconductor chip package or carrier substrate.

In the drawings described below, reference numerals are generally repeated where identical elements appear in more than one figure. Turning now to the drawings, and in particular to FIG. 1, therein is shown a sectional view of an exemplary embodiment of a semiconductor chip package 10 that includes a semiconductor chip 15 mounted on a semiconductor chip package or carrier substrate 20. The chip 15 is covered by a heat spreader in the form of a lid 25 that is secured to the substrate 20 by way of an adhesive 30. The semiconductor chip 15 is depicted in a flip-chip arrangement and electrically connected to the substrate 20 by way of a plurality of solder joints 35 that connect to various conductors in and on the substrate 20 that are not visible. The semiconductor chip 15 may be any of a myriad of different types of circuit devices used in electronics, such as, for example, microprocessors, graphics processors, combined microprocessor/graphics processors, application specific integrated circuits, memory devices, lasers or the like, and may be single or multi-core. The semiconductor chip 15 may be fabricated using silicon, germanium or other semiconductor materials. If desired, the chip 15 may be fabricated as a semiconductor-on-insulator substrate or as bulk semiconductor. If desired, stacked chips could be implemented. The solder joints 35 may be composed of lead-based or lead-free solders. An underfill material layer 40 is positioned between the chip 15 and the substrate 20 to lessen the effects of differences in CTE between the chip 15 and the substrate 20. The underfill material 40 may be composed of well-known epoxy materials, such as epoxy resin with or without silica fillers and phenol resins or the like. Two examples are types 8437-2 and 2BD available from Namics.

The carrier substrate 20 may be organic, ceramic or the like. If organic, the substrate may be standard core, thin core or coreless, and composed of well-known epoxies and fillers or the like. The carrier substrate 20 may interface electrically with another device, such as a socket or printed circuit board in a variety of ways. In this illustrative embodiment, a pin grid array 35 projects downwardly from the substrate 20. However, it should be understood that other interconnects, such as ball grid arrays, land grid arrays or other types of interconnects may be used.

The lid 25 may be a top hat, bathtub or other heat spreader configuration and composed of well-known plastics, ceramics or metallic materials as desired. Some exemplary materials include nickel plated copper, anodized aluminum, aluminum-silicon-carbide, aluminum nitride, boron nitride or the like. In this illustrative embodiment, the lid 25 consists of a copper core 50 surrounded by a nickel jacket 55.

In order to establish a thermally conducting pathway between the semiconductor chip 15 and a lower surface 60 of the lid 25, a solder thermal interface material 65 is positioned between the semiconductor chip 15 and a thermal interface structure 70 that is advantageously provided with a plurality of carbon nanotubes. The plural carbon nanotubes are not visible in FIG. 1 but will be disclosed and described in conjunction with subsequent figures. The solder thermal interface material layer 65 may be composed of various solders, such as indium, tin-silver, bismuth-tin, and tin solders. Relatively low melting points are favored since relatively high temperatures may degrade the carbon nanotubes (not visible) in the thermal interface structure 70. A backside metallization layer or stack 75 may be provided on the upper surface of the semiconductor chip 15 to provide one or more layers that facilitate metallurgical bonding with the solder thermal interface material 65. The materials suitable for the stack 75 will depend on the type of thermal interface material 65. In one exemplary embodiment, the stack 75 may consist of an aluminum film formed on the semiconductor chip 15, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold from migrating into the semiconductor chip 15, the nickel-vanadium film provides desirable adhesion between gold and titanium, and the gold film provides a desirable wetting surface for solders, such as indium.

Figure 2:
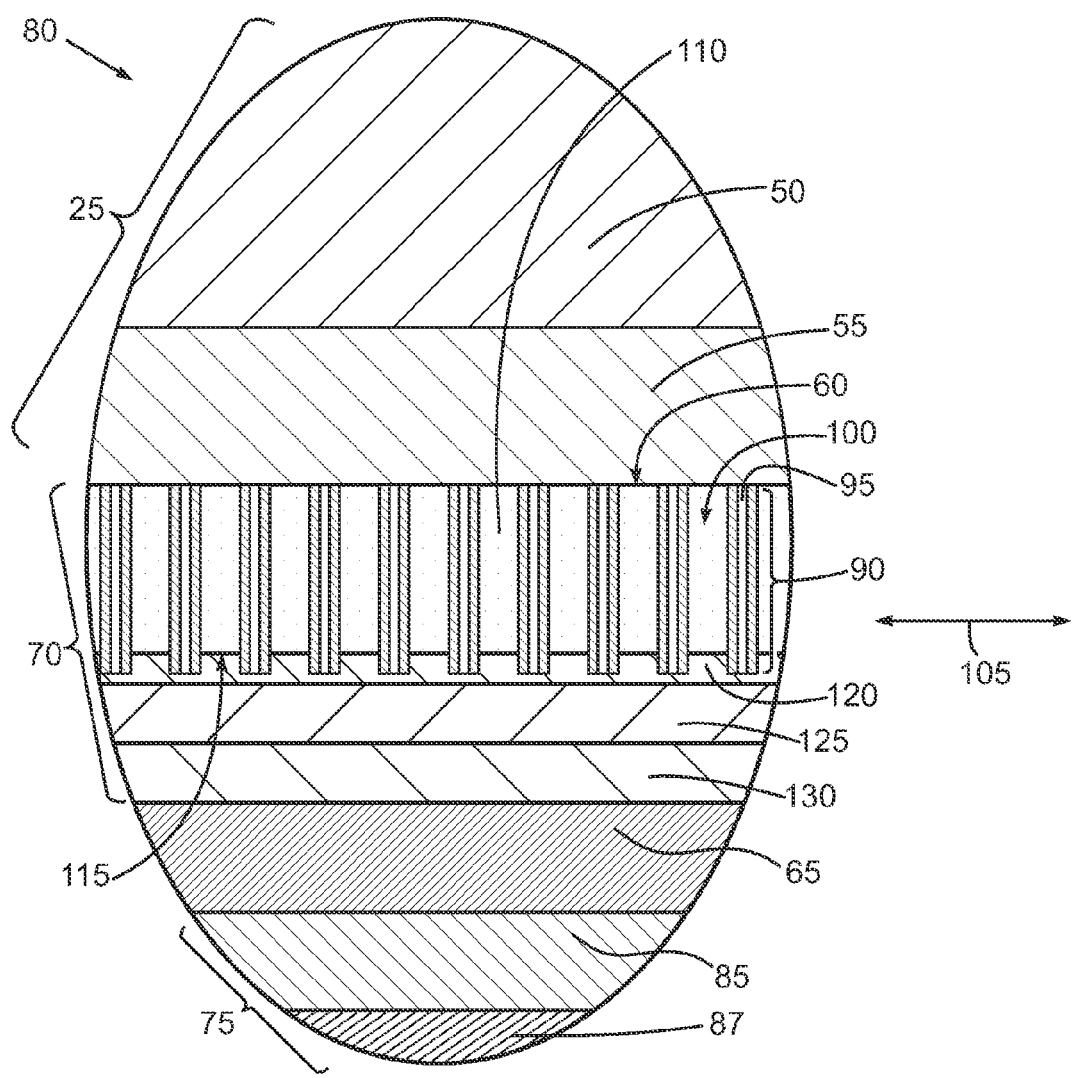
FIG. 2 is a portion of FIG. 1 shown at greater magnification.

Additional details of the thermal interface structure 70 may be understood by referring now to FIG. 2, which is the portion of FIG. 1 circumscribed by the dashed oval 80 shown at greater magnification. Note that because of the position of the dashed oval 80, a portion of the copper jacket 50 and the nickel coating 55 of the lid 25, as well as the thermal interface structure 70, the solder thermal interface material layer 65 and a portion of the backside metallization stack 75 are all visible in FIG. 2. As noted above, the backside metallization stack 75 may include a top layer composed of a material that readily wets to various types of solder. In this illustrative embodiment, the top layer 85 may be composed of gold and one layer 87 of the intermediary layers may be composed of nickel-vanadium. As noted above, the thermal interface structure 70 includes a plurality of carbon nanotubes that form a so-called forest 90 of individual carbon nanotubes 95. The forest 90 is depicted as a uniform pattern for ease of illustration. However, a less regular pattern may be formed. The carbon nanotubes 95 of the forest 90 are attached at one end 100 to the lower surface 60 of the lid 25. As described in more detail below, this fastening of the ends 100 of the tubes 95 may be accomplished by actually growing the tubes 95 from the lower surface 60 of the lid 25, however, another deposition technique may be used. A purpose of the nanotube forest 90 is to provide a thermally conductive yet shear strain resistant layer that joins the semiconductor chip 15 shown in FIG. 1 to the lid 25. The nanotube forest 90 is capable of withstanding significant shear strains in the plane defined by the axis 105 and an orthogonal axis (not shown) coming in and out of the page. In this way, the nanotube forest 90 can behave mechanically not unlike a grove of palm trees that are capable of swaying back and forth in a stiff breeze. The upper reaches of the tubes 95 may be surrounded by a compliant material layer 110 that is designed to provide additional strength to the nanotube forest and to inhibit the migration of metallic materials down in between the individual tubes 95. The compliant material layer 110 may reduce migration of metals into the spaces between the tubes that might otherwise reduce the compliant nature of the tubes 95. The compliant layer 110 advantageously terminates just a little bit above the ends 115 of the tubes 95.

While carbon nanotubes exhibit favorable strength and flexibility, they do not natively submit to soldering processes. Accordingly, at least one solderable layer, and in this illustrative embodiment, a stack of metal layers is positioned beneath the carbon nanotube forest 90 to provide a solderable laminate. The stack in this illustrative embodiment consists of metal layers 120, 125 and 130. The layer 120 coats the ends 115 of the tubes 95 and may be composed of materials that readily adhere to carbon nanotubes. Exemplary materials include titanium, chromium or the like. The layer 120 may have a thickness of about 10 to 50 nm. The metal layer 125 may be formed on the layer 120 to serve as an intermediary that adheres well to the layer 120 and to the layer 130. Exemplary materials include nickel, nickel-vanadium, copper, silver, combinations of these or the like. The thickness of the layer 125 may be about 100 to 500 nm. Finally, the metal layer 130 may be formed on the metal layer 125 and serve as a solder wettable surface to readily bond to the solder thermal interface material layer 65. Exemplary materials include gold, platinum, palladium, combinations of these or the like. The thickness of the layer 130 may be about 100 to 200 nm.

Figure 3:
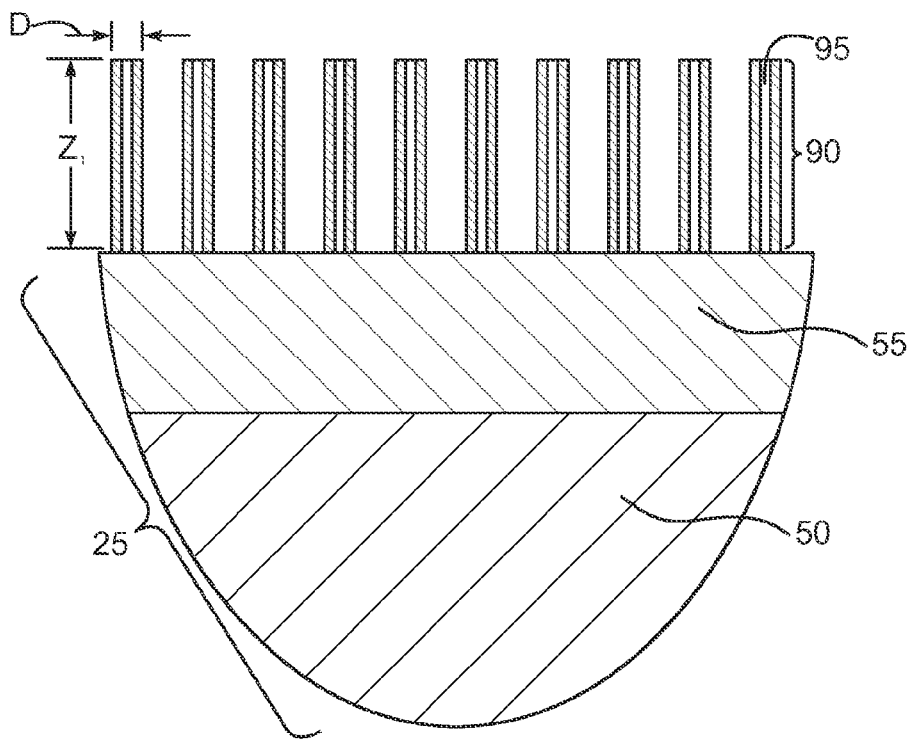
FIG. 3 is a sectional view like FIG. 2, but depicting a portion of an exemplary method of fabricating a thermal interface structure on a heat spreader.

An exemplary method for fabricating the thermal interface structure 70 depicted in FIGS. 1 and 2 may be understood by referring now to FIGS. 3, 4, 5, 6 and 7 and initially to FIG. 3. FIG. 3 is a sectional view like FIG. 2, but at an intermediary stage of processing. In this regard, FIG. 2 depicts the portion of the lid 25 including the copper core 50 and the nickel coating 55 flipped over 180° from the orientation depicted in FIG. 2. The lid 25 may be positioned in a suitable reactor and a carbon nanotube formation process performed to establish the forest 90 of the carbon nanotubes 95. In this illustrative embodiment, the tubes 95 may be grown directly on the nickel coating layer 55. In order to provide a favorable flexibility and thus resistance to shear stresses, the tubes 95 may be grown with a relatively large aspect ratio, R, given by:

$$R = \frac{Z_1}{D} \quad (1)$$

where $Z_1$ is the tube height and D is the tube diameter. Exemplary tube heights may be many tens to hundreds of microns and diameters may range from a few tens to over a hundred nanometers. It should be understood that although the tubes 95 of the nanotube forest 90 are depicted as geometrically perfect structures all with a uniform diameter and height, in reality the tubes 95 of the forest 90 may have some variability in both diameter, length and actual shape. The tubes 95 may be a single wall or multi-wall as desired and may have open or closed ends depending on the application process. Depending on how long the tube growth process is performed, the tubes 95 may actually intertwine with one another at some point and form a mesh-like structure.

Figure 4:
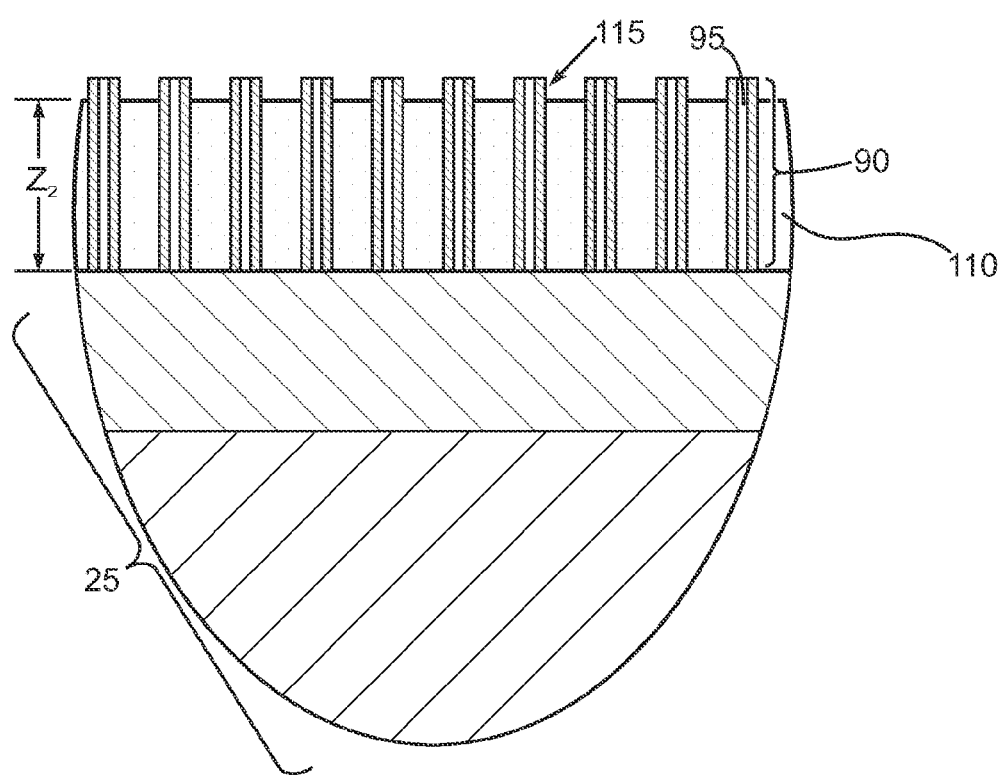
FIG. 4 is a sectional view like FIG. 3, but depicting another portion of an exemplary method of fabricating a thermal interface structure on a heat spreader.

Attention is now turned to FIG. 4, which depicts the application of the compliant layer 110 over the tubes 95 of the forest 90. It may be possible to deposit the layer 110 with a depth, $Z_2$, that is slightly less than, $Z_1$, in order to leave the ends 115 of the tubes 95 exposed. Optionally, the compliant layer 110 may be blanket deposited over the carbon nanotubes 95 of the forest 90 and a subsequent material removal step such as a wet or dry etch may be performed in order to expose the ends 15 of the tubes 95. Various materials may be used for the layer 110, such as silicone, polyimide or the like.

Figure 5:
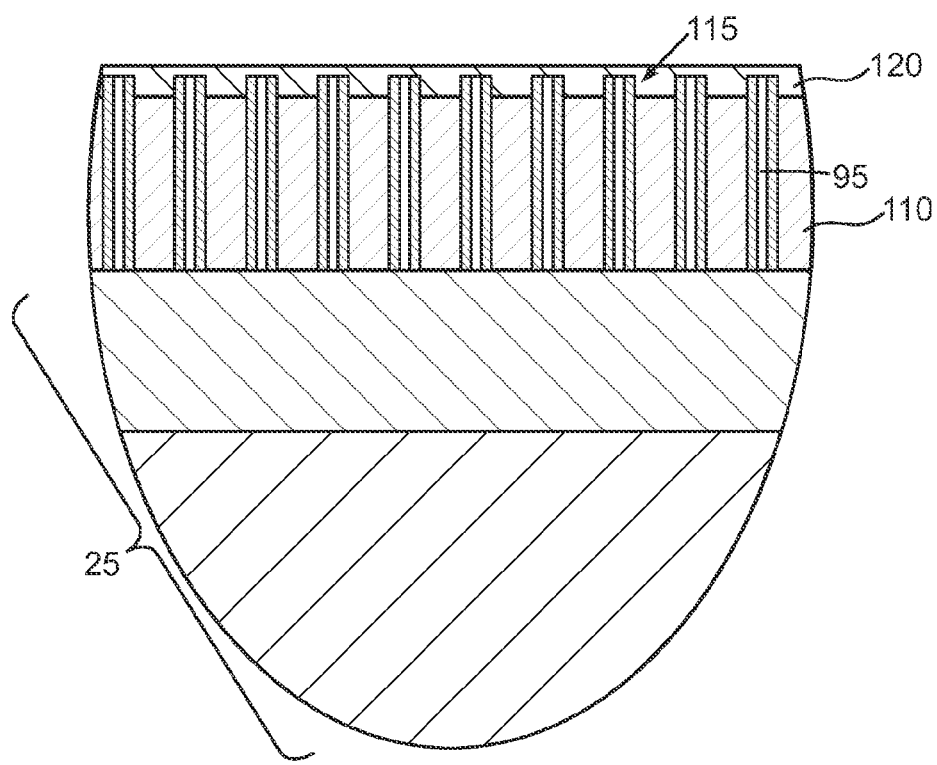
FIG. 5 is a sectional view like FIG. 4, but depicting another portion of an exemplary method of fabricating a thermal interface structure on a heat spreader.

Referring now to FIG. 5, the metal layer 120 may be applied over the ends 115 of the tubes 95 and on the compliant layer 110. A variety of techniques may be used to apply the metal layer 120, such as physical vapor deposition. This may be performed by placing the lid 25 in a suitable processing chamber. As noted elsewhere herein exemplary materials include titanium and chromium or the like. Again the compliant layer 110 serves not only as a strength enhancer but also as a physical impediment to the migration of metal material from the layer 120 down into the interstices between the individual tubes 95 which might otherwise reduce the flexibility of the tubes 95.

The thickness of the layer 125 may be about 100 to 500 nm. Finally, the metal layer 130 may be formed on the metal layer 125 and serve as a solder wettable surface to readily bond to the solder thermal interface material layer 65. Exemplary materials include gold, platinum, palladium, combinations of these or the like. The thickness of the layer 130 may be about 100 to 200 nm.

Figure 6:
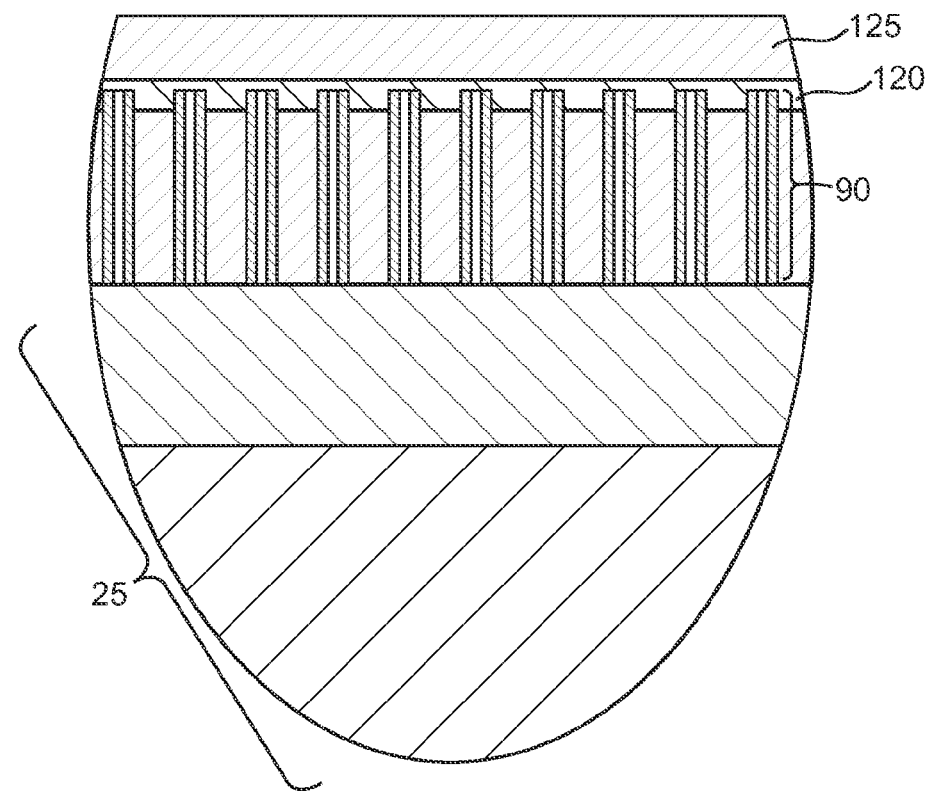
FIG. 6 is a sectional view like FIG. 5, but depicting another portion of an exemplary method of fabricating a thermal interface structure on a heat spreader.

Referring now to FIG. 6, the metal layer 125 may be deposited on the metal layer 120 again by placing the lid 25 in a suitable processing chamber. A variety of techniques may be used to apply the metal layer 125, such as physical vapor deposition or high temperature evaporation. Exemplary materials include nickel, nickel-vanadium, copper, silver, combinations of these or the like.

Figure 7:
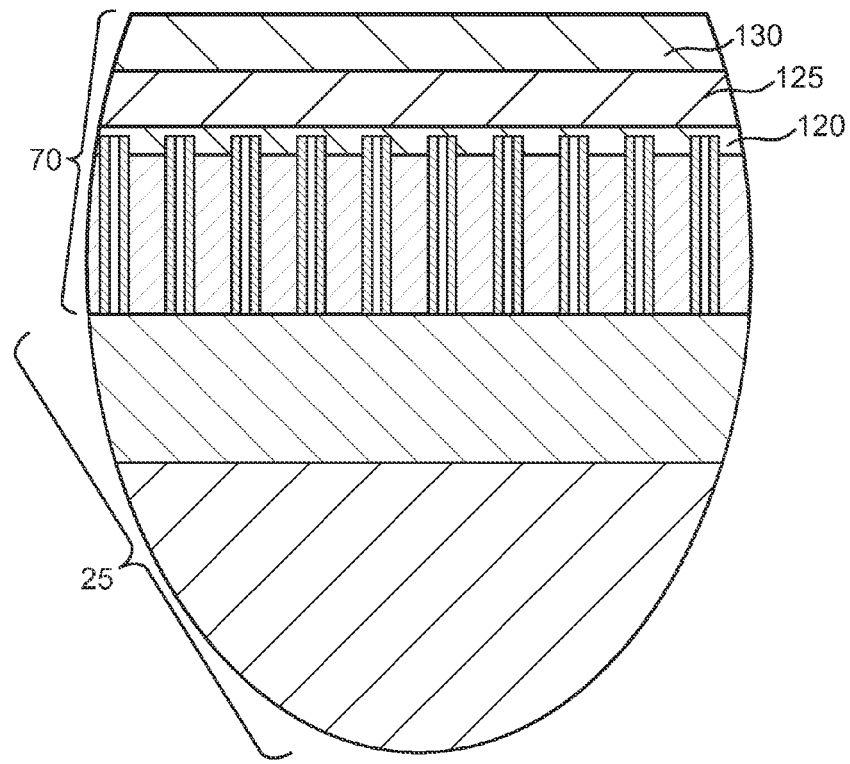
FIG. 7 is a sectional view like FIG. 6, but depicting another portion of an exemplary method of fabricating a thermal interface structure on a heat spreader.

Attention is now turned to FIG. 7. The metal layer 130 may be deposited on the metal layer 125 to complete the formation of the thermal interface structure 70. This may be accomplished by again placing the lid 125 in a suitable processing chamber. A variety of processing may be used to deposit the layer 130 such as high temperature evaporation or plating. At this stage, the thermal interface structure 70 may be readied for soldering.

Figure 8:
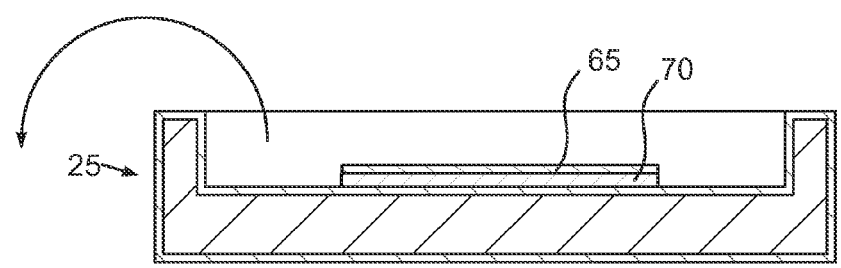
FIG. 8 is a sectional view of an exemplary method of coupling an exemplary thermal interface structure to a semiconductor chip.
Figure 8:
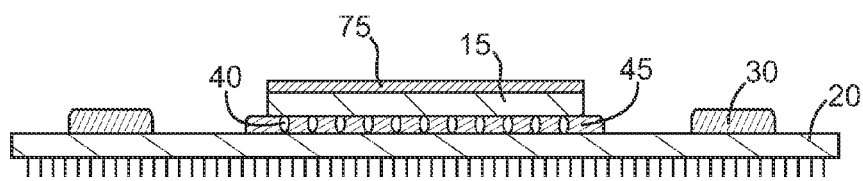

In order to solder the thermal interface structure 70 to the chip 15 depicted in FIG. 1, a variety of processes may be used. One exemplary method is depicted in conjunction with FIG. 8, which is a sectional view depicting the lid 25 flipped over relative to the package substrate 20 and the semiconductor chip 15. Prior to the attachment of the lid 25, the chip 15 has undergone a reflow process in order to establish the solder joints 35 and an underfill deposition and curing process to establish the underfill 40. The solder thermal interface material layer 65 may be formed on the thermal interface structure 70 by, for example, a solder electrode plating process that may be suitable for example using indium, or by placing a preform of solder material on the thermal interface structure 70. It may be necessary to compensate for native oxide and/or contaminant build up on the solderable surfaces. In one option, a suitable chemical flux may be applied to the thermal interface structure 70 prior to application of the solder thermal interface material 65. Flux should also be applied to the metallization stack 75 of the semiconductor chip 15. In another option, oxide buildup may be addressed by performing a solder reflow in either a vacuum or inert atmosphere. In still another option, the reflow may be performed just after exposure to a reducing atmosphere. Finally, an etch process may precede reflow and/or flux application to strip away oxide buildup.

At this point, the lid 25 may be flipped over and the solder thermal interface material layer 65 brought into proximity to the back side metallization stack 75 and a reflow process formed in order to establish a metallurgical bond between the thermal interface material layer 65 and the back side metallization 75 and perhaps the thermal interface structure 70 as well if no metallurgical bond exists between those two structures 70 and 75 at this point. The reflow process may be performed in an oven or other heating system at a temperature sufficient to reflow the solder layer 65. The lid adhesive 30 may be cured to provide a bond with the lid 25 either during the solder reflow process or during a discrete thermal process as desired.

Figure 9:
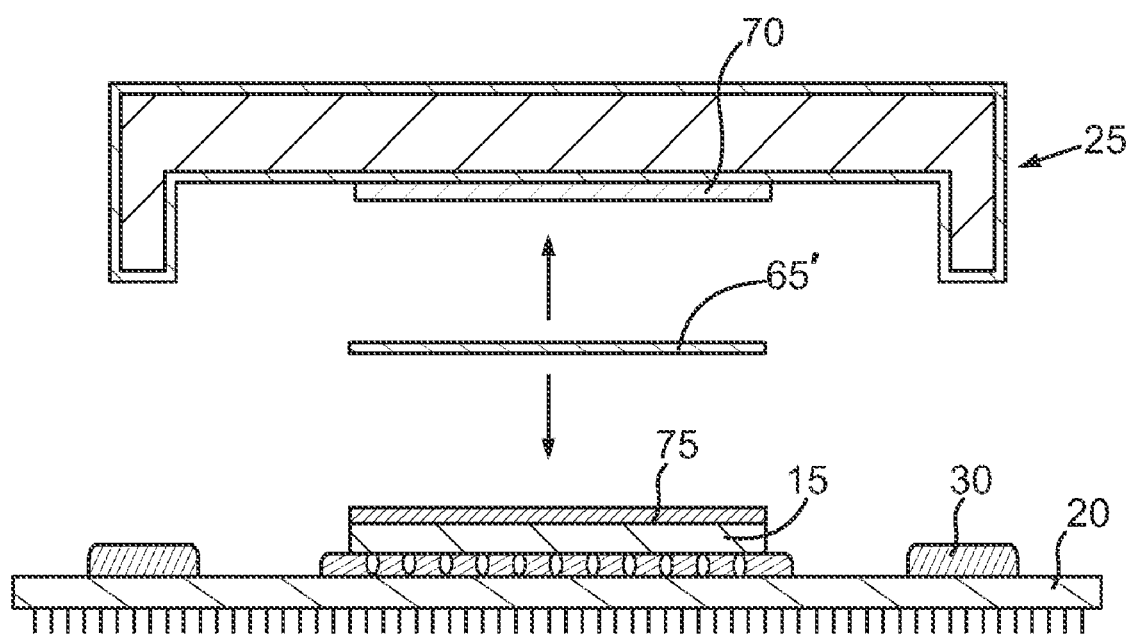
FIG. 9 is a sectional view of alternate exemplary methods of coupling an exemplary thermal interface structure to a semiconductor chip.

Another exemplary process for soldering the thermal interface structure 70 to the semiconductor chip 15 may be understood by referring now to FIG. 9, which is a partially exploded sectional view. Here, the solder connection between the thermal interface structure 70 and the semiconductor chip 15 may be established by using a solder preform 65' composed of the solder materials described elsewhere herein. The solder preform 65' may be either attached to the thermal interface structure 70 by way of flux, or to the back side metallization 75 of the chip 15 again by way of flux or may merely be positioned between the thermal interface structure 70 and the backside metallization 75 while the lid 25 seated on the adhesive 30 on the substrate 20 and a solder reflow process performed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling first ends of plural carbon nanotubes to a surface of a heat spreader, the carbon nanotubes including second ends;
   interspersing a compliant material around the first ends while leaving the second ends exposed after the first ends are coupled to the surface;
   coupling at least one solderable metal layer to the second ends;
   positioning a solder between the at least one solderable metal layer and a side of a semiconductor chip; and
   performing a reflow to solder the at least one solderable metal layer to the side of the semiconductor chip.

2. The method of claim 1, wherein the solder comprises indium, tin-silver or tin-bismuth.

3. The method of claim 1, wherein the heat spreader comprises a semiconductor chip package lid.

4. The method of claim 1, wherein the at least one solderable metal comprises a titanium layer coating the second ends, a nickel layer coating the titanium layer and a gold layer coating the nickel layer.

5. The method of claim 1, wherein the positioning the solder comprises placing a solder preform or plating solder.

6. The method of claim 1, wherein the coupling the plural carbon nanotubes comprises growing the plural carbon nanotubes on the surface.

7. A method of manufacturing, comprising:
   coupling first ends of plural carbon nanotubes to a surface of a heat spreader, the carbon nanotubes having second ends and at least one solderable metal layer coating the second ends;
   interspersing a compliant material around the first ends after the first ends are coupled to the surface;
   positioning a solder between the at least one solderable metal layer and a side of a semiconductor chip, the semiconductor chip coupled to a carrier substrate; and
   performing a reflow to solder the at least one solderable metal layer to the side of the semiconductor chip.

8. The method of claim 7, wherein the heat spreader comprises a semiconductor chip package lid.

9. The method of claim 7, wherein the at least one solderable metal layer comprises a titanium layer coating the second ends, a nickel layer coating the titanium layer and a gold layer coating the nickel layer.

10. The method of claim 7, wherein the positioning the solder comprises placing a solder preform or plating solder.

11. The method of claim 7, wherein the solder comprises indium, tin-silver or tin-bismuth.

12. An apparatus, comprising:
    a heat spreader having a surface;
    plural carbon nanotubes, the carbon nanotubes including first ends coupled directly to the surface and second ends;
    a compliant material coupled to the surface and dispersed around the first ends;
    a solderable metal layer coupled to the second ends, the solderable metal layer having a first side facing toward the surface and a second side facing away from the surface; and
    a solder positioned on the second side of the solderable metal layer.

13. The apparatus of claim 12, comprising a semiconductor chip coupled to the solderable metal layer by the solder.

14. The apparatus of claim 12, wherein the heat spreader comprises a semiconductor chip package lid.

15. The apparatus of claim 12, wherein the at least one solderable metal comprises a titanium layer coating the second ends, a nickel layer coating the titanium layer and a gold layer coating the nickel layer.

16. The apparatus of claim 12, comprising a carrier substrate coupled to the semiconductor chip.

17. The apparatus of claim 12, wherein the solder comprises indium, tin-silver or tin-bismuth.

\* \* \* \* \*